United States Patent
Koide

(10) Patent No.: US 12,310,162 B2
(45) Date of Patent: May 20, 2025

(54) DETECTION DEVICE

(71) Applicant: Japan Display Inc., Tokyo (JP)

(72) Inventor: Gen Koide, Tokyo (JP)

(73) Assignee: Japan Display Inc., Tokyo (JP)

( * ) Notice: Subject to any disclaimer, the term of this patent is extended or adjusted under 35 U.S.C. 154(b) by 426 days.

(21) Appl. No.: 17/856,492

(22) Filed: Jul. 1, 2022

(65) Prior Publication Data
US 2023/0018255 A1    Jan. 19, 2023

(30) Foreign Application Priority Data
Jul. 13, 2021    (JP) ................. 2021-115988

(51) Int. Cl.
H10K 39/32    (2023.01)
G01J 1/44    (2006.01)
H10K 30/40    (2023.01)

(52) U.S. Cl.
CPC .......... *H10K 39/32* (2023.02); *G01J 1/44* (2013.01); *H10K 30/40* (2023.02); *G01J 2001/446* (2013.01)

(58) Field of Classification Search
CPC . H10K 39/32; H10K 30/40; G01J 1/44; G01J 2001/446
See application file for complete search history.

(56) References Cited

U.S. PATENT DOCUMENTS

| | | |
|---|---|---|
| 2009/0027358 A1 | 1/2009 | Hosono |
| 2012/0306041 A1 | 12/2012 | Fujiyoshi et al. |
| 2013/0087682 A1 | 4/2013 | Nomura |
| 2023/0393727 A1* | 12/2023 | Seino ............... G06F 3/046 |

FOREIGN PATENT DOCUMENTS

| | | | |
|---|---|---|---|
| JP | 2009-032005 A | | 2/2009 |
| JP | 2009158510 A | * | 7/2009 |
| JP | 2011-253861 A | | 12/2011 |
| JP | 2013-012715 A | | 1/2013 |
| JP | 2014-225524 A | | 12/2014 |

OTHER PUBLICATIONS

Office Action issued in related Japanese Patent Application No. 2021-115988 on Jul. 2, 2024 and English translation of same. 7 pages.

* cited by examiner

*Primary Examiner* — Georgia Y Epps
*Assistant Examiner* — Monica T Taba
(74) *Attorney, Agent, or Firm* — K&L Gates LLP

(57) ABSTRACT

According to an aspect, a detection device includes: photodiodes provided on a substrate; transistors corresponding to the photodiodes; a first organic insulating film that covers the transistors; first electrodes that are between the first organic insulating film and the photodiodes in a direction orthogonal to the substrate and are provided corresponding to the photodiodes; a second electrode provided so as to extend across the photodiodes; an insulating film between adjacent first electrodes, and a second organic insulating film that covers an inside of a contact hole provided in the first organic insulating film. The photodiodes includes a first carrier transport layer, an active layer, and a second carrier transport layer that are stacked on the substrate. The first carrier transport layer, the active layer, and the second carrier transport layer are provided so as to cover each of the first electrodes, the insulating film, and the second organic insulating film.

6 Claims, 8 Drawing Sheets

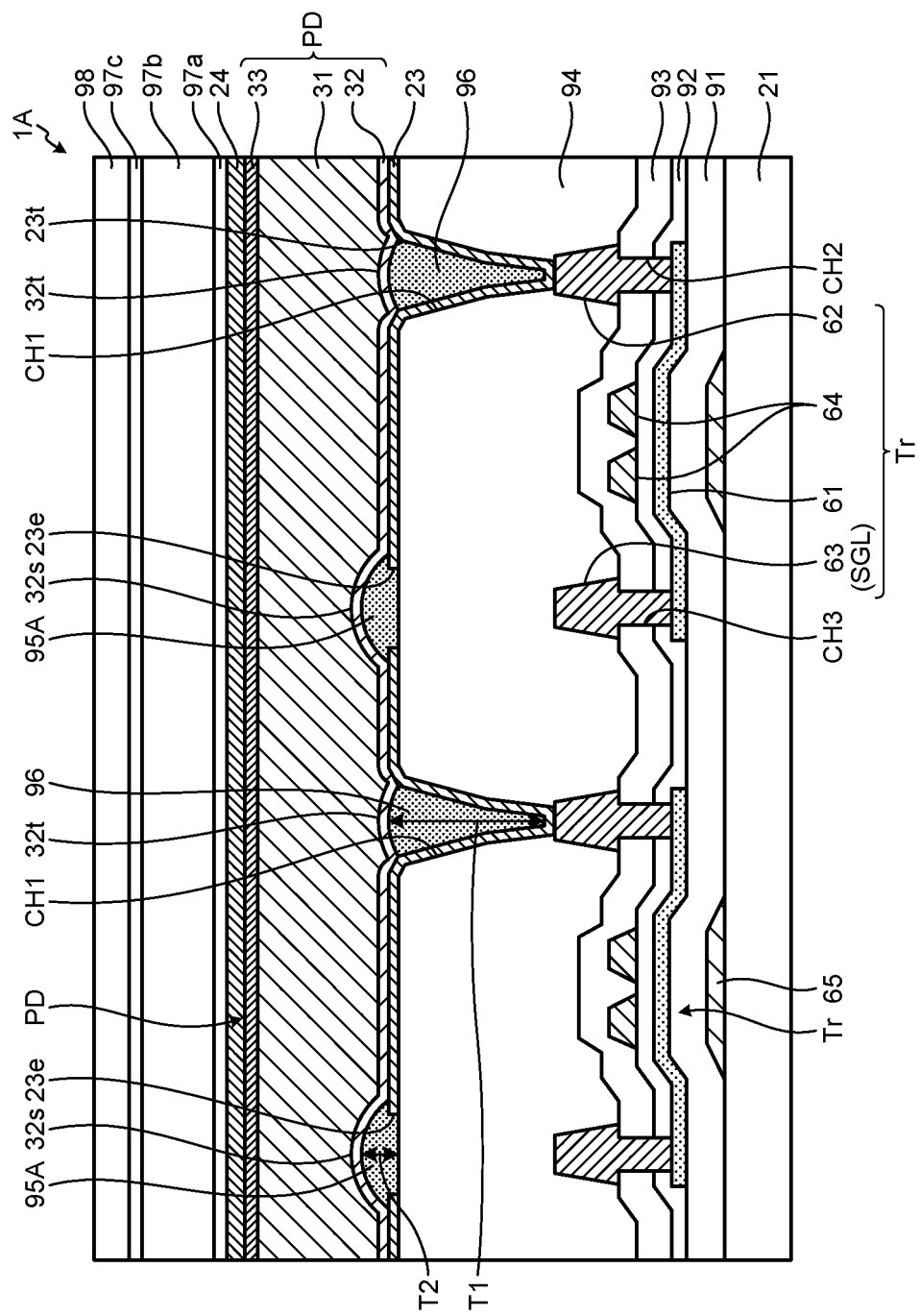

DETECTION DEVICE

CROSS-REFERENCE TO RELATED APPLICATION

This application claims the benefit of priority from Japanese Patent Application No. 2021-115988 filed on Jul. 13, 2021, the entire contents of which are incorporated herein by reference.

BACKGROUND

1. Technical Field

What is disclosed herein relates to a detection device.

2. Description of the Related Art

Optical sensors capable of detecting fingerprint patterns and vascular patterns are known (for example, Japanese Patent Application Laid-open Publication No. 2009-032005). Such optical sensors each include a plurality of photodiodes each including an organic semiconductor material used as an active layer. Each of the photodiodes is disposed between a lower electrode and an upper electrode, and, for example, the lower electrode, an electron transport layer, the active layer, a hole transport layer, and the upper electrode are stacked in this order.

In areas where the electron transport layer (or the hole transport layer) disposed between the active layer and the lower electrode is thinly formed and the coverage of the electron transport layer is insufficient, a short circuit may occur between the active layer and the lower electrode.

For the foregoing reasons, there is a need for a detection device capable of reducing the occurrence of the short circuit between the active layer and the lower electrode.

SUMMARY

According to an aspect, a detection device includes: a plurality of photodiodes provided on a substrate; a plurality of transistors provided corresponding to the photodiodes; a first organic insulating film that covers the transistors; a plurality of first electrodes that are provided between the first organic insulating film and the photodiodes in a direction orthogonal to the substrate and are provided corresponding to the photodiodes; a second electrode provided so as to extend across the photodiodes; an insulating film provided between adjacent first electrodes of the first electrodes, and a second organic insulating film that covers an inside of a contact hole provided in the first organic insulating film. The photodiodes include a first carrier transport layer, an active layer, and a second carrier transport layer that are stacked on the substrate. The first carrier transport layer, the active layer, and the second carrier transport layer are provided so as to cover each of the first electrodes, the insulating film, and the second organic insulating film.

BRIEF DESCRIPTION OF THE DRAWINGS

FIG. 8 is a sectional view illustrating a section of a detection device according to a second embodiment.

DETAILED DESCRIPTION

Figure 1:
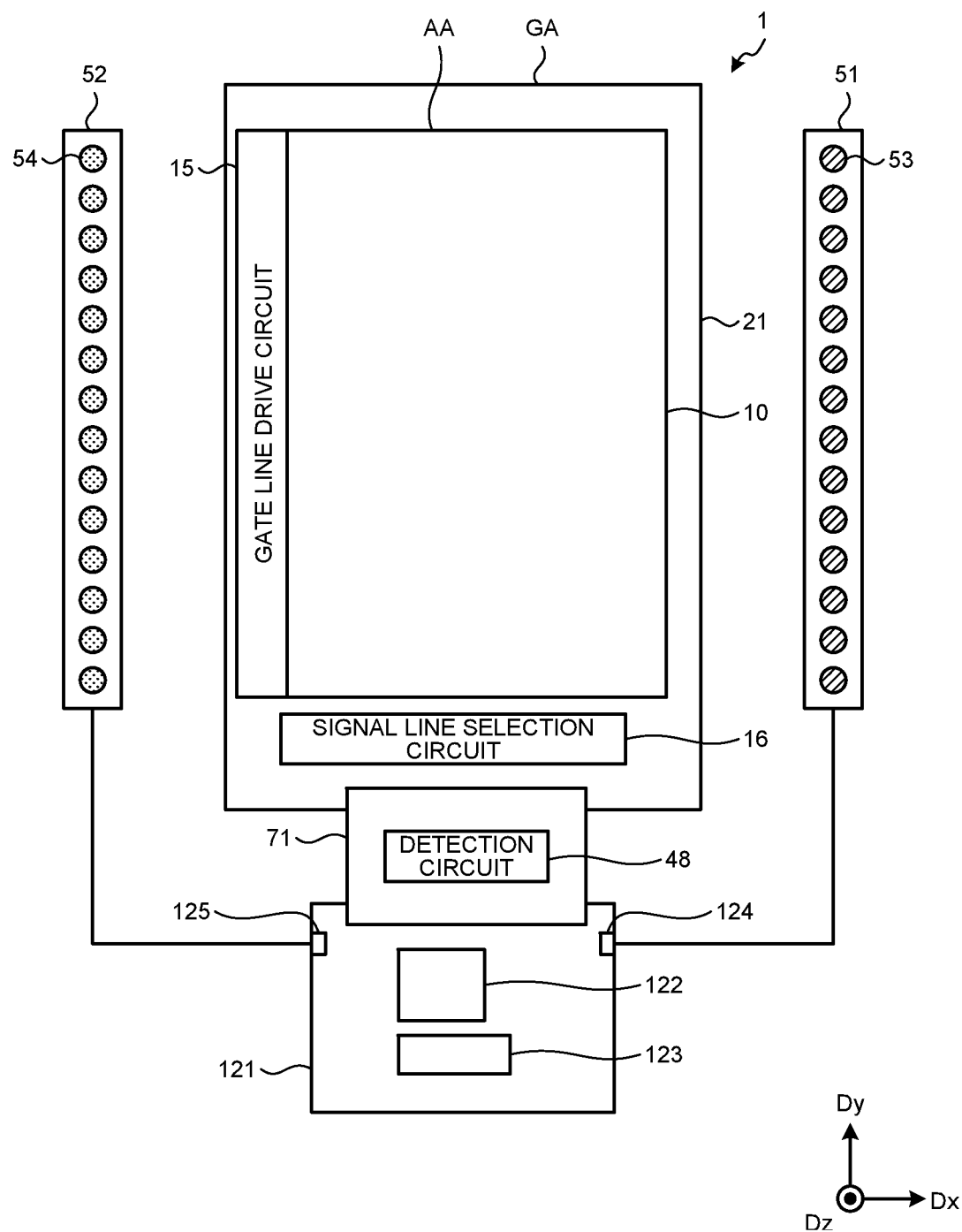
FIG. 1 is a plan view illustrating a detection device according to a first embodiment.

The following describes modes (embodiments) for carrying out the present invention in detail with reference to the drawings. What is disclosed herein is not limited to the description of the embodiments given below. Components described below include those easily conceivable by those skilled in the art or those substantially identical thereto. In addition, the components described below can be combined as appropriate. The present disclosure is merely an example and naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on/above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

FIG. 1 is a plan view illustrating a detection device according to a first embodiment. As illustrated in FIG. 1, a detection device 1 includes a substrate 21, a sensor 10, a gate line drive circuit 15, a signal line selection circuit 16, a detection circuit 48, a control circuit 122, a power supply circuit 123, a first light source base member 51, a second light source base member 52, first light sources 53, and second light sources 54. The first light source base member 51 is provided with the first light sources 53. The second light source base member 52 is provided with the second light sources 54.

The substrate 21 is electrically coupled to a control substrate 121 through a wiring substrate 71. The wiring substrate 71 is, for example, a flexible printed circuit board or a rigid circuit board. The wiring substrate 71 is provided with the detection circuit 48. The control substrate 121 is provided with the control circuit 122 and the power supply circuit 123. The control circuit 122 is, for example, a field-programmable gate array (FPGA). The control circuit 122 supplies control signals to the sensor 10, the gate line drive circuit 15, and the signal line selection circuit 16 to control a detection operation of the sensor 10. The control circuit 122 supplies control signals to the first and the second light sources 53 and 54 to control lighting and non-lighting of the first and the second light sources 53 and 54. The power supply circuit 123 supplies voltage signals including, for example, a sensor power supply signal (sensor power supply voltage) VDDSNS (refer to FIG. 4) to the sensor 10, the gate line drive circuit 15, and the signal line selection circuit 16. The power supply circuit 123 supplies a power supply voltage to the first and the second light sources 53 and 54.

The substrate 21 has a detection area AA and a peripheral area GA. The detection area AA is an area provided with a plurality of photodiodes PD (refer to FIG. 4) included in the sensor 10. The peripheral area GA is an area between the outer perimeter of the detection area AA and outer edges of the substrate 21 and is an area not provided with the photodiodes PD.

The gate line drive circuit 15 and the signal line selection circuit 16 are provided in the peripheral area GA. Specifically, the gate line drive circuit 15 is provided in an area extending along a second direction Dy in the peripheral area GA. The signal line selection circuit 16 is provided in an area extending along a first direction Dx in the peripheral area GA, and is provided between the sensor 10 and the detection circuit 48.

In the following description, the first direction Dx is one direction in a plane parallel to the substrate 21. The second direction Dy is one direction in the plane parallel to the substrate 21 and is a direction orthogonal to the first direction Dx. The second direction Dy may non-orthogonally intersect the first direction Dx. The term "plan view" refers to a positional relation when viewed from a direction orthogonal to the substrate 21.

The first light sources 53 are provided on the first light source base member 51 and are arranged along the second direction Dy. The second light sources 54 are provided on the second light source base member 52 and are arranged along the second direction Dy. The first light source base member 51 and the second light source base member 52 are electrically coupled, through respective terminals 124 and 125 provided on the control substrate 121, to the control circuit 122 and the power supply circuit 123.

For example, inorganic light-emitting diodes (LEDs) or organic electroluminescent (EL) diodes (organic light-emitting diodes: OLEDs) are used as the first and the second light sources 53 and 54. The first and the second light sources 53 and 54 emit first and second light, respectively, having different wavelengths.

The first light emitted from the first light sources 53 is mainly reflected on a surface of an object to be detected such as a finger and is incident on the sensor 10. As a result, the sensor 10 can detect a fingerprint by detecting a shape of asperities on the surface of the finger or the like. The second light emitted from the second light sources 54 is mainly reflected in the finger or the like, or transmitted through the finger or the like, and is incident on the sensor 10. As a result, the sensor 10 can detect information on a living body in the finger or the like. Examples of the information on the living body include a pulse wave, pulsation, and a vascular image of the finger or a palm. That is, the detection device 1 may be configured as a fingerprint detection device to detect a fingerprint or a vascular detection device to detect a vascular pattern of, for example, veins.

The first light may have a wavelength of from 500 nm to 600 nm, for example, a wavelength of approximately 550 nm, and the second light may have a wavelength of from 780 nm to 950 nm, for example, a wavelength of approximately 850 nm. In this case, the first light is blue or green visible light, and the second light is infrared light. The sensor 10 can detect a fingerprint based on the first light emitted from the first light sources 53. The second light emitted from the second light sources 54 is reflected in the object to be detected such as a finger, or transmitted through or absorbed by a finger or the like, and is incident on the sensor 10. As a result, the sensor 10 can detect the pulse wave or the vascular image (vascular pattern) as the information on the living body in the finger or the like.

Alternatively, the first light may have a wavelength of from 600 nm to 700 nm, for example, approximately 660 nm, and the second light may have a wavelength of from 780 nm to 900 nm, for example, approximately 850 nm. In this case, the sensor 10 can detect a blood oxygen saturation level in addition to the pulse wave, the pulsation, and the vascular image as the information on the living body based on the first light emitted from the first light sources 53 and the second light emitted from the second light sources 54. Thus, the detection device 1 includes the first and the second light sources 53 and 54, and therefore, can detect the various information on the living body by performing the detection based on the first light and the detection based on the second light.

The arrangement of the first and the second light sources 53 and 54 illustrated in FIG. 1 is merely an example, and may be changed as appropriate. The detection device 1 is provided with a plurality of types of light sources (first and second light sources 53 and 54) as the light sources. However, the light sources are not limited thereto, and may be of one type. For example, the first and the second light sources 53 and 54 may be arranged on each of the first and the second light source base members 51 and 52. The first and the second light sources 53 and 54 may be provided on one light source base member, or three or more light source base members. At least one light source needs to be disposed.

Figure 2:
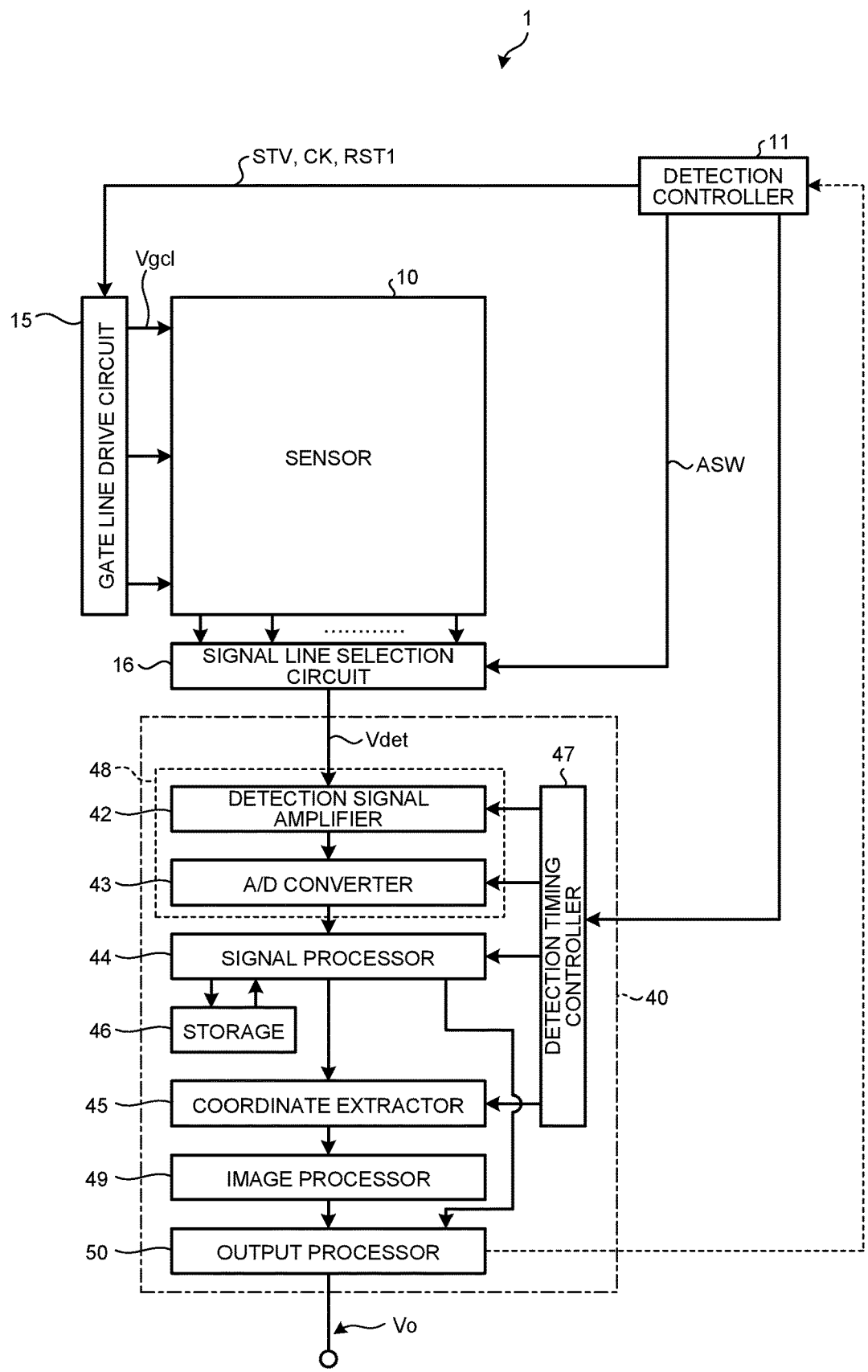
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a detection controller (detection control circuit) 11 and a detector (detection signal processing circuit) 40. The control circuit 122 includes one, some, or all of the functions of the detection controller 11. The control circuit 122 also includes one, some, or all of the functions of the detector 40 except those of the detection circuit 48.

The sensor 10 includes the photodiodes PD. Each of the photodiodes PD included in the sensor 10 outputs an electric signal corresponding to light irradiating the photodiode PD as a detection signal Vdet to the signal line selection circuit 16. The sensor 10 performs the detection in response to a gate drive signal Vgcl supplied from the gate line drive circuit 15.

The detection controller 11 is a circuit that supplies respective control signals to the gate line drive circuit 15, the signal line selection circuit 16, and the detector 40 to control operations thereof. The detection controller 11 supplies various control signals such as a start signal STV, a clock signal CK, and a reset signal RST1 to the gate line drive circuit 15. The detection controller 11 also supplies various control signals such as a selection signal ASW to the signal line selection circuit 16. The detection controller 11 supplies various control signals to the first and the second light sources 53 and 54 to control the lighting and non-lighting of the respective first and second light sources 53 and 54.

The gate line drive circuit 15 is a circuit that drives a plurality of gate lines GCL (refer to FIG. 3) based on the various control signals. The gate line drive circuit 15 sequentially or simultaneously selects the gate lines GCL and supplies the gate drive signals Vgcl to the selected gate lines GCL. By this operation, the gate line drive circuit 15 selects the photodiodes PD coupled to the gate lines GCL.

Figure 3:
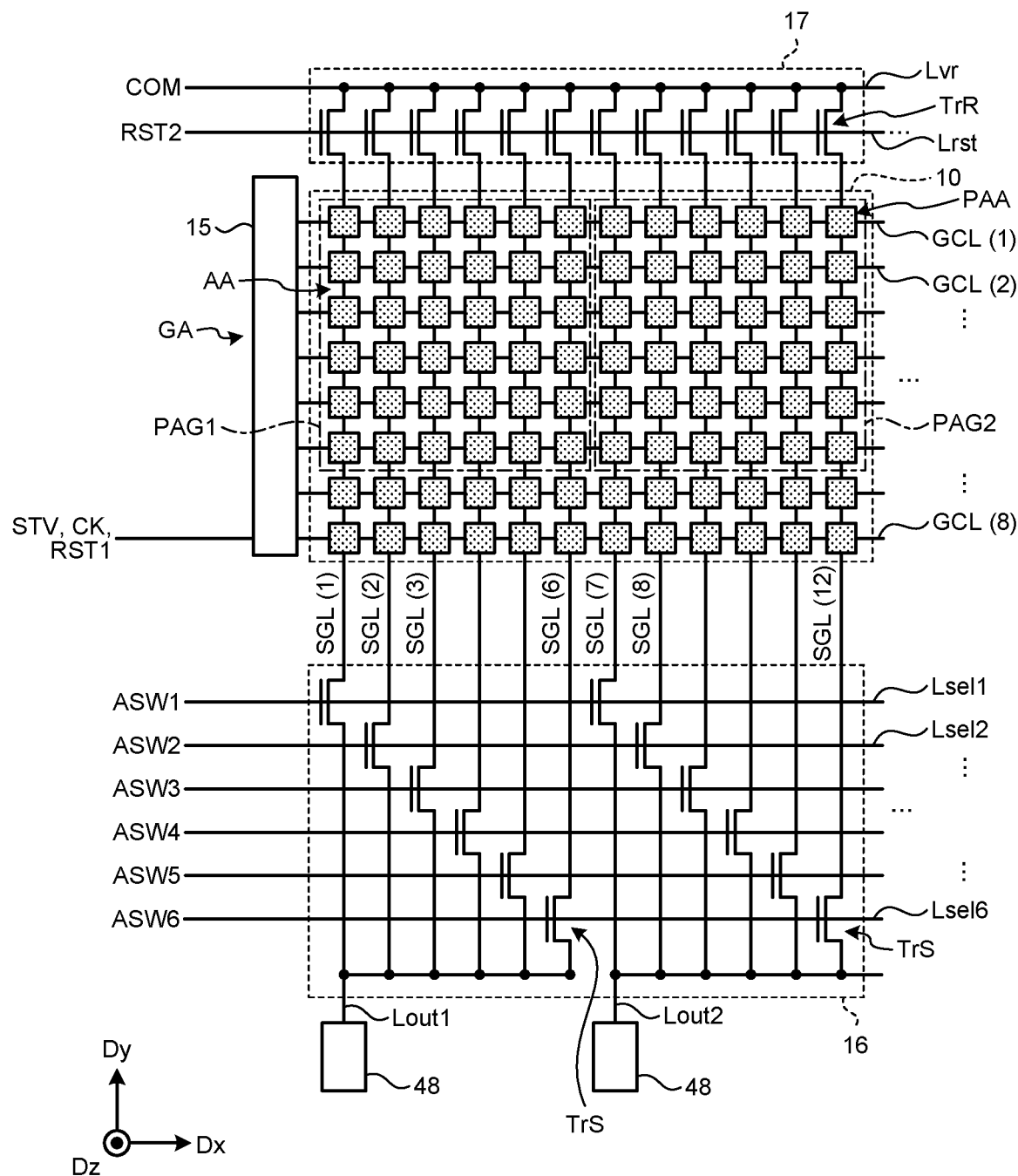
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 is, for example, a multiplexer. The signal line selection circuit 16 couples the selected signal lines SGL to the detection circuit 48 based on the selection signal ASW supplied from the detection controller 11. By this operation, the signal line selection circuit 16 outputs the detection signals Vdet of the photodiodes PD to the detector 40.

The detector 40 includes the detection circuit 48, a signal processor (signal processing circuit) 44, a coordinate extractor (coordinate extraction circuit) 45, a storage (storage circuit) 46, a detection timing controller (detection timing control circuit) 47, an image processor (image processing circuit) 49, and an output processor (output processing circuit) 50. Based on a control signal supplied from the detection controller 11, the detection timing controller 47 controls the detection circuit 48, the signal processor 44, the coordinate extractor 45, and the image processor 49 so as to operate in synchronization with one another.

The detection circuit 48 is, for example, an analog front-end (AFE) circuit. The detection circuit 48 is a signal processing circuit having functions of at least a detection signal amplifier 42 and an analog-to-digital (A/D) converter 43. The detection signal amplifier 42 amplifies the detection signals Vdet. The A/D converter 43 converts analog signals output from the detection signal amplifier 42 into digital signals.

The signal processor 44 is a logic circuit that detects a predetermined physical quantity received by the sensor 10 based on an output signal of the detection circuit 48. When a finger is in contact with or in proximity to a detection surface, the signal processor 44 can detect the asperities on the surface of the finger or the palm based on the signal from the detection circuit 48. The signal processor 44 can also detect the information on the living body based on the signal from the detection circuit 48. Examples of the information on the living body include the vascular image, the pulse wave, the pulsation, and the blood oxygen level of the finger or the palm.

The signal processor 44 may also perform processing of acquiring the detection signals Vdet (information on the living body) simultaneously detected by the photodiodes PD, and averaging the detection signals Vdet. In this case, the detector 40 can perform stable detection by reducing measurement errors caused by relative positional misalignment between the object to be detected, such as a finger, and the sensor 10.

The storage 46 temporarily stores therein a signal calculated by the signal processor 44. The storage 46 may be, for example, a random-access memory (RAM) or a register circuit.

The coordinate extractor 45 is a logic circuit that obtains detected coordinates of the asperities on the surface of a finger or the like when the contact or the proximity of the finger is detected by the signal processor 44. The coordinate extractor 45 is also a logic circuit that obtains detected coordinates of blood vessels of the finger or the palm. The image processor 49 combines the detection signals Vdet output from the respective photodiodes PD of the sensor 10 to generate two-dimensional information indicating the shape of the asperities on the surface of the finger or the like and two-dimensional information indicating the shape of the blood vessels of the finger or the palm. The coordinate extractor 45 may output the detection signals Vdet as sensor output voltages Vo instead of calculating the detected coordinates. A case can be considered where the detector 40 does not include the coordinate extractor 45 and the image processor 49.

The output processor 50 serves as a processor that performs processing based on the outputs from the photodiodes PD. The output processor 50 may include, for example, the detected coordinates obtained by the coordinate extractor 45 and the two-dimensional information generated by the image processor 49 in the sensor output voltages Vo. The function of the output processor 50 may be integrated into another component (such as the image processor 49).

The following describes a circuit configuration example of the detection device 1. FIG. 3 is a circuit diagram illustrating the detection device. As illustrated in FIG. 3, the sensor 10 includes a plurality of detection elements PAA arranged in a matrix having a row-column configuration. Each of the detection elements PAA is provided with the photodiode PD.

The gate lines GCL extend in the first direction Dx and are coupled to the detection elements PAA arranged in the first direction Dx. A plurality of gate lines GCL(1), GCL(2), . . . , GCL(8) are arranged in the second direction Dy, and are each coupled to the gate line drive circuit 15. In the following description, the gate lines GCL(1), GCL(2), . . . , GCL(8) will each be simply referred to as the gate line GCL when they need not be distinguished from one another. For ease of understanding of the description, FIG. 3 illustrates eight gate lines GCL. However, this is merely an example, and M gate lines GCL (where M is eight or larger, and is, for example, 256) may be arranged.

The signal lines SGL extend in the second direction Dy and are coupled to the photodiodes PD of the detection elements PAA arranged in the second direction Dy. A plurality of signal lines SGL(1), SGL(2), . . . , SGL(12) are arranged in the first direction Dx and are each coupled to the signal line selection circuit 16 and a reset circuit 17. In the following description, the signal lines SGL(1), SGL(2), . . . , SGL(12) will each be simply referred to as the signal line SGL when they need not be distinguished from one another.

For ease of understanding of the description, 12 signal lines SGL are illustrated. However, this is merely an example, and N signal lines SGL (where N is 12 or larger, and is, for example, 252) may be arranged. The resolution of the sensor is, for example, 508 dots per inch (dpi), and the number of cells is 252×256. In FIG. 3, the sensor 10 is provided between the signal line selection circuit 16 and the reset circuit 17. The present disclosure is not limited thereto. The signal line selection circuit 16 and the reset circuit 17 may be coupled to ends in the same direction of the signal lines SGL.

The gate line drive circuit 15 receives the various control signals such as the start signal STV, the clock signal CK, and the reset signal RST1 from the control circuit 122 (refer to FIG. 1). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and corresponding ones of the detection elements PAA arranged in the first direction Dx are selected as detection targets.

The signal line selection circuit 16 includes a plurality of selection signal lines Lsel, a plurality of output signal lines Lout, and third switching elements TrS. The third switching elements TrS are provided corresponding to the signal lines SGL. Six signal lines SGL(1), SGL(2), ..., SGL(6) are coupled to a common output signal line Lout1. Six signal lines SGL(7), SGL(8), ..., SGL(12) are coupled to a common output signal line Lout2. The output signal lines Lout1 and Lout2 are each coupled to the detection circuit 48.

The signal lines SGL(1), SGL(2), ..., SGL(6) are grouped into a first signal line block, and the signal lines SGL(7), SGL(8), ..., SGL(12) are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks.

The control circuit 122 (refer to FIG. 1) sequentially supplies the selection signal ASW to the selection signal lines Lsel. This operation causes the signal line selection circuit 16 to operate the third switching elements TrS to sequentially select the signal lines SGL in one of the signal line blocks in a time-division manner. The signal line selection circuit 16 selects one of the signal lines SGL in each of the signal line blocks. With the above-described configuration, the detection device 1 can reduce the number of integrated circuits (ICs) including the detection circuit 48 or the number of terminals of the ICs. The signal line selection circuit 16 may couple more than one of the signal lines SGL collectively to the detection circuit 48.

As illustrated in FIG. 3, the reset circuit 17 includes a reference signal line Lvr, a reset signal line Lrst, and fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference signal line Lvr. The power supply circuit 123 supplies a reference signal COM to the reference signal line Lvr. This operation supplies the reference signal COM to a capacitive element Ca (refer to FIG. 4) included in each of the detection elements PAA.

Figure 4:
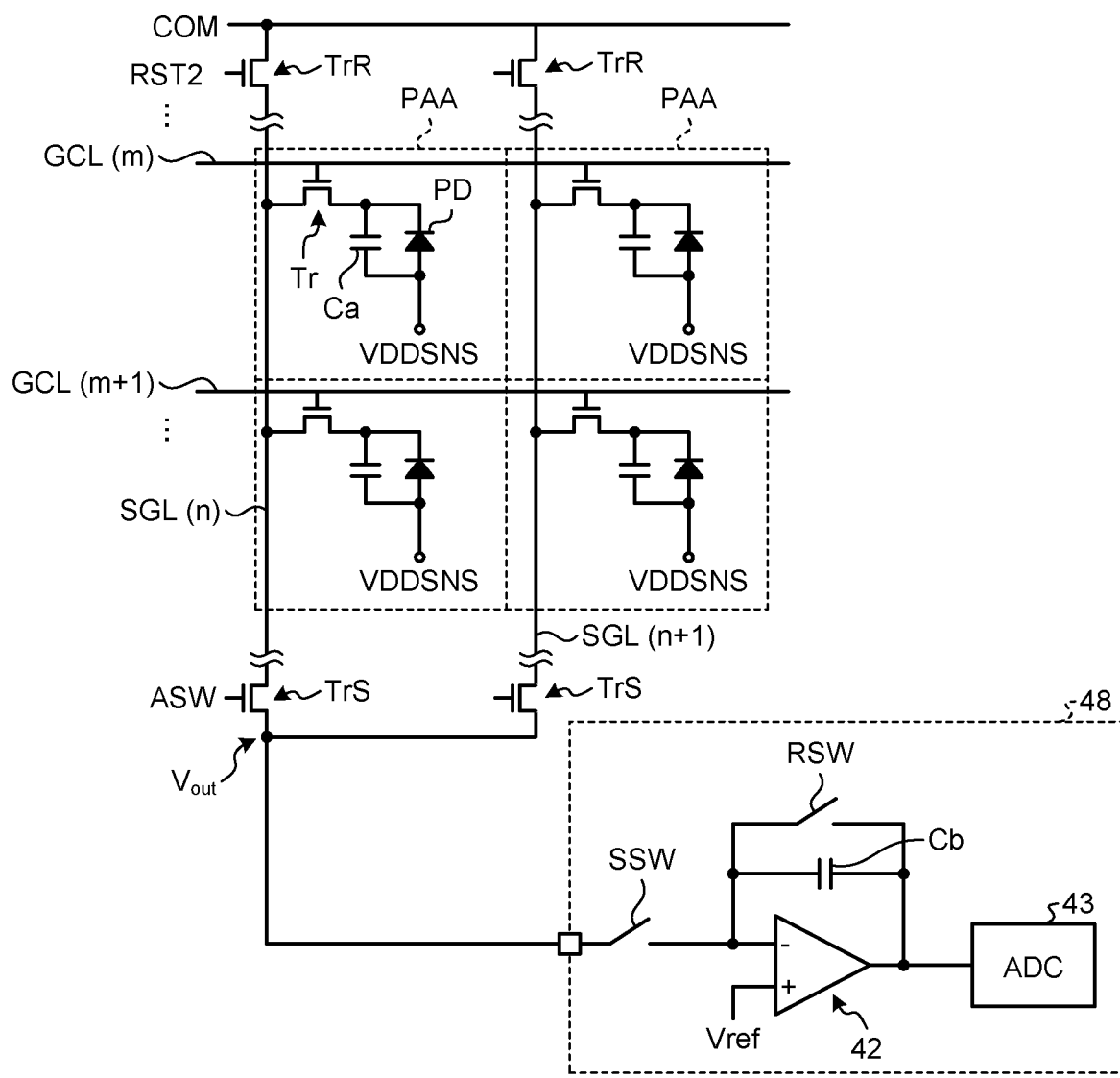
FIG. 4 is a circuit diagram illustrating a plurality of detection elements.

FIG. 4 is a circuit diagram illustrating the detection elements. FIG. 4 also illustrates a circuit configuration of the detection circuit 48. As illustrated in FIG. 4, each of the detection elements PAA includes the photodiode PD, the capacitive element Ca, and a corresponding one of the first switching elements Tr. The capacitive element Ca is capacitance (sensor capacitance) generated in the photodiode PD, and is equivalently coupled in parallel with the photodiode PD.

FIG. 4 illustrates two gate lines GCL(m) and GCL(m+1) arranged in the second direction Dy among the gate lines GCL. FIG. 4 also illustrates two signal lines SGL(n) and SGL(n+1) arranged in the first direction Dx among the signal lines SGL. The detection element PAA is an area surrounded by the gate lines GCL and the signal lines SGL.

The first switching elements Tr are provided corresponding to the photodiodes PD. Each of the first switching elements Tr is fabricated from a thin-film transistor, and in this example, fabricated from an re-channel metal oxide semiconductor (MOS) thin-film transistor (TFT).

The gates of the first switching elements Tr belonging to the detection elements PAA arranged in the first direction Dx are coupled to the gate line GCL. The sources of the first switching elements Tr belonging to the detection elements PAA arranged in the second direction Dy are coupled to the signal line SGL. The drain of the first switching element Tr is coupled to the cathode of the photodiode PD and the capacitive element Ca.

The anode of the photodiode PD is supplied with the sensor power supply signal VDDSNS from the power supply circuit 123. The signal line SGL and the capacitive element Ca are supplied with the reference signal COM that serves as an initial potential of the signal line SGL and the capacitive element Ca from the power supply circuit 123.

When the detection element PAA is irradiated with light, a current corresponding to the amount of the light flows through the photodiode PD. As a result, an electric charge is stored in the capacitive element Ca. After the first switching element Tr is turned on, a current corresponding to the electric charge stored in the capacitive element Ca flows through the signal line SGL. The signal line SGL is coupled to the detection circuit 48 through a corresponding one of the third switching elements TrS of the signal line selection circuit 16. Thus, the detection device 1 can detect a signal corresponding to the amount of the light irradiating the photodiode PD in each of the detection elements PAA or each block unit PAG.

During a reading period, a switch SSW is turned on to couple the detection circuit 48 to the signal line SGL. The detection signal amplifier 42 of the detection circuit 48 converts a current supplied from the signal line SGL into a voltage corresponding to the value of the current, and amplifies the result. A reference potential (Vref) having a fixed potential is supplied to a non-inverting input terminal (+) of the detection signal amplifier 42, and the signal line SGL is coupled to an inverting input terminal (−) of the detection signal amplifier 42. In the present embodiment, the same signal as the reference signal COM is supplied as the reference potential (Vref) voltage. The signal processor 44 (refer to FIG. 2) calculates the difference between the detection signal Vdet when light irradiates the photodiode PD and the detection signal Vdet when light does not irradiate the photodiode PD as each of the sensor output voltages Vo. The detection signal amplifier 42 includes a capacitive element Cb and a reset switch RSW. During a reset period, the reset switch RSW is turned on to reset an electric charge of the capacitive element Cb.

Figure 5:
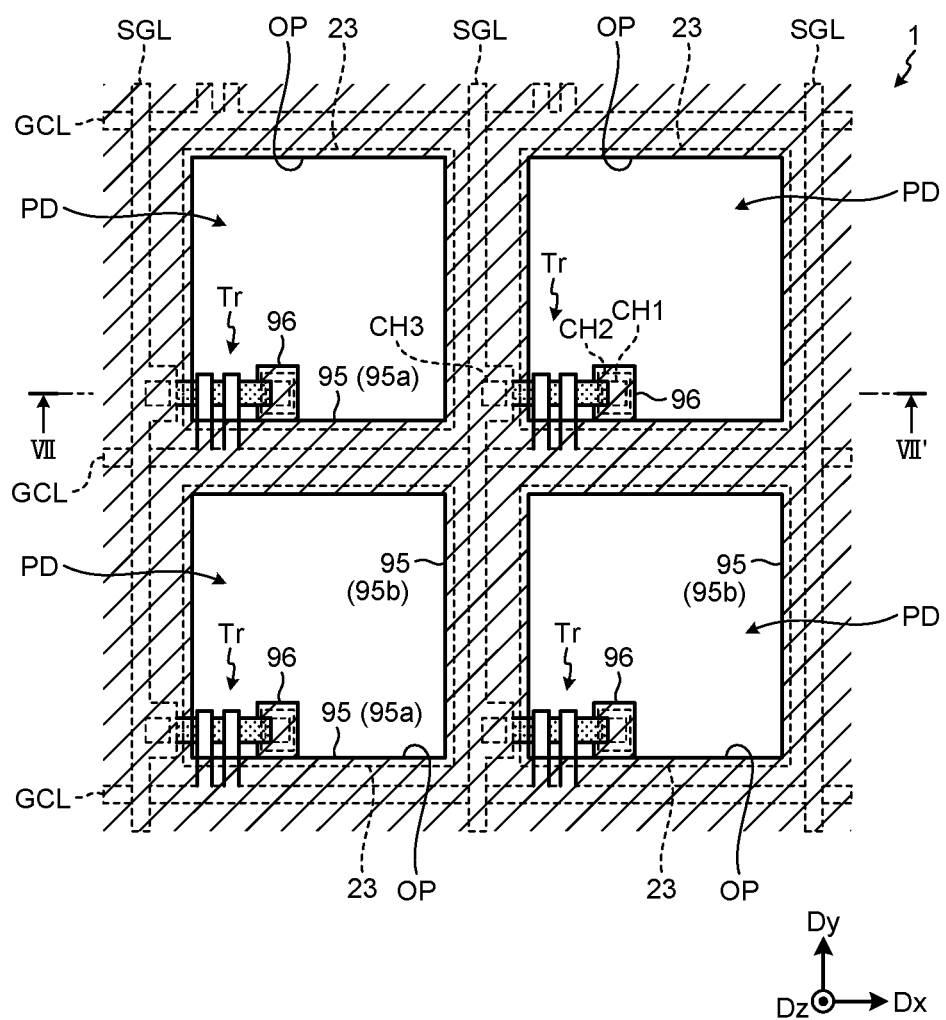
FIG. 5 is a plan view schematically illustrating the detection device according to the first embodiment.
Figure 6:
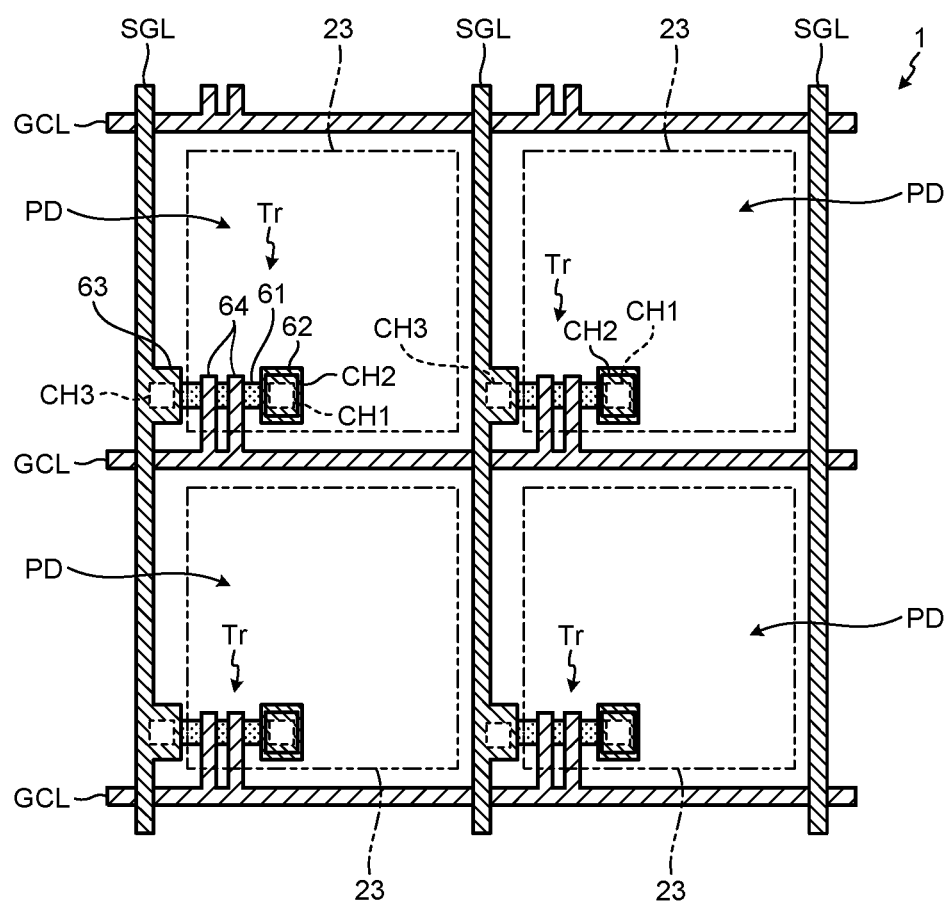
FIG. 6 is a plan view schematically illustrating first electrodes and transistors of the detection device according to the first embodiment.

The following describes a configuration of the photodiode PD. FIG. 5 is a plan view schematically illustrating the detection device according to the first embodiment. FIG. 6 is a plan view schematically illustrating first electrodes and transistors of the detection device according to the first embodiment. For ease of viewing, FIG. 5 illustrates an insulating film 95 with oblique lines. FIG. 6 is a plan view schematically illustrating a portion of the detection device without the insulating film illustrated in FIG. 5.

As illustrated in FIGS. 5 and 6, the photodiode PD, a first electrode 23, and the first switching element Tr are provided in an area surrounded by the gate lines GCL and the signal lines SGL. The first electrode 23 is a lower electrode (cathode electrode) of the photodiode PD, and the photodiodes PD and the first electrodes 23 are arranged in a matrix having a row-column configuration on the substrate 21.

As illustrated in FIG. 5, the insulating film 95 is provided between the first electrodes 23 that are adjacent to each other and covers the outer perimeters of the first electrodes 23. In more detail, the insulating film 95 includes first portions 95a extending in the first direction Dx and second portions 95b extending in the second direction Dy. The insulating film 95 is provided in a grid pattern in which the first portions 95a and the second portions 95b intersect each other.

Each of the first portions 95a is provided so as to overlap the gate line GCL and is provided between the first electrodes 23 adjacent in the second direction Dy with the gate line GCL interposed therebetween. Each of the second portions 95b is provided so as to overlap the signal line SGL and is provided between the first electrodes 23 adjacent in the first direction Dx with the signal line SGL interposed therebetween. In other words, the first electrodes 23 are partitioned by the insulating film 95. The first electrodes 23 are each coupled to an electron transport layer 32 (refer to FIG. 7) of the photodiode PD at an opening OP formed in the insulating film 95.

As illustrated in FIG. 6, the first switching element Tr includes a semiconductor layer 61, a source electrode 62, a drain electrode 63, and a gate electrode 64. The semiconductor layer 61 extends along the gate line GCL and is provided so as to intersect the gate electrode 64 in the plan view. The gate electrode 64 is coupled to the gate line GCL and extends in a direction orthogonal to the gate line GCL. One end side of the semiconductor layer 61 is coupled to the source electrode 62 through a second contact hole CH2. The first electrode 23 is electrically coupled to the source electrode 62 of the first switching element Tr through a first contact hole CH1. As a result, the first switching element Tr is electrically coupled to the photodiode PD. The other end side of the semiconductor layer 61 is coupled to the drain electrode 63 through a third contact hole CH3. The drain electrode 63 is coupled to the signal line SGL.

As illustrated in FIG. 5, a second organic insulating film 96 is provided so as to cover the first contact hole CH1. A detailed configuration of the second organic insulating film 96 and photodiode PD will be described with reference to FIG. 7. The configuration and the arrangement of the first switching element Tr illustrated in FIGS. 5 and 6 are merely exemplary and can be changed as appropriate.

Figure 7:
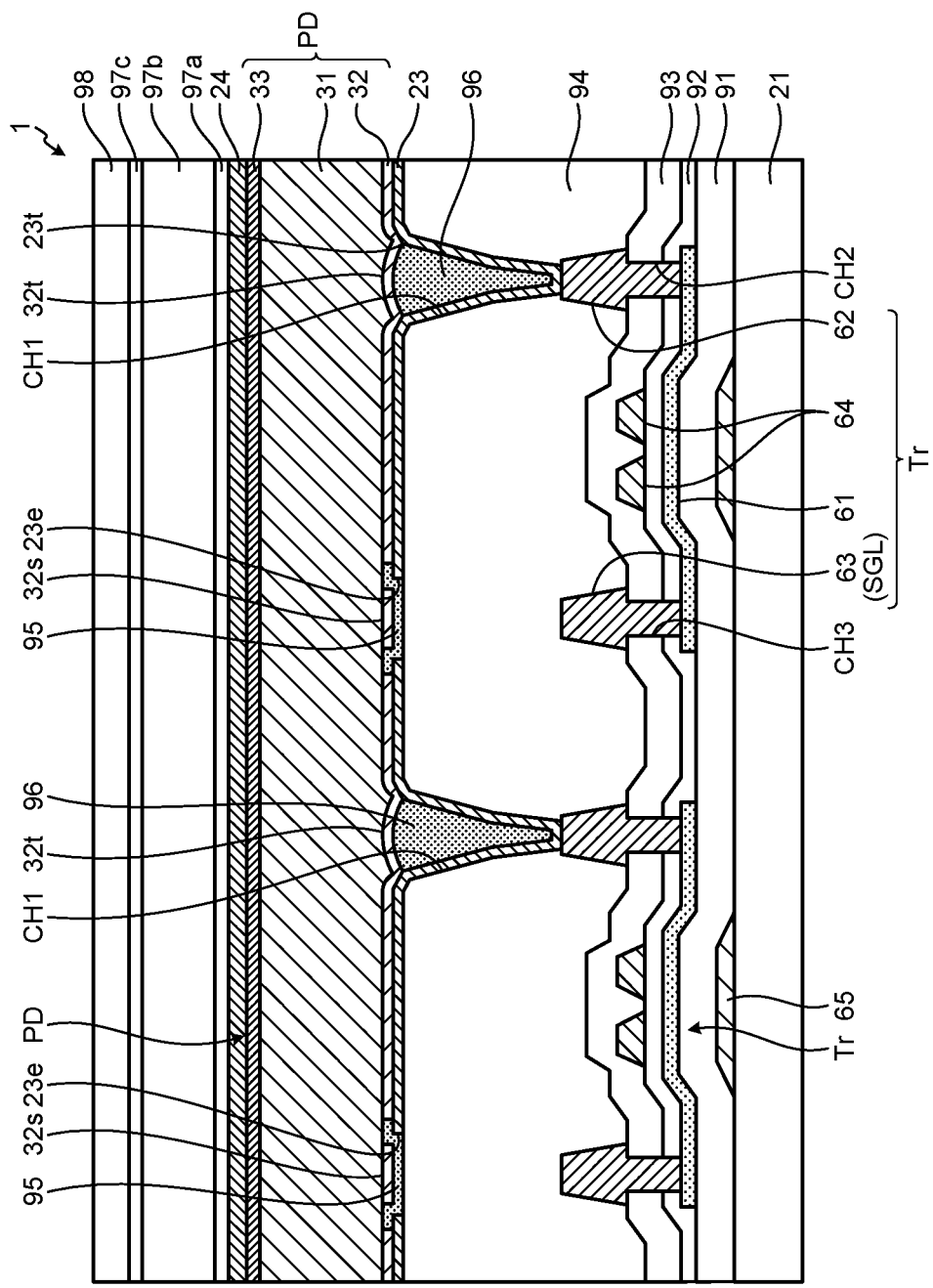
FIG. 7 is a VII-VII' sectional view of FIG. 5.

FIG. 7 is a VII-VII' sectional view of FIG. 5. As illustrated in FIG. 7, the detection device 1 includes the substrate 21, the first switching elements Tr, a first organic insulating film 94, the first electrodes 23, the insulating film 95, the second organic insulating film 96, the photodiodes PD, a second electrode 24, sealing films 97a, 97b, and 97c, and a resin mask 98.

The substrate 21 is an insulating base member and is made using, for example, glass or a resin material. The substrate 21 is not limited to having a flat plate shape and may have a curved surface. In this case, the substrate 21 may be a film-like resin.

Herein, a direction from the substrate 21 toward the photodiode PD in a direction orthogonal to a surface of the substrate 21 is referred to as "upper side" or simply "on/above". A direction from the photodiode PD toward the substrate 21 is referred to as "lower side" or simply "beneath/below".

A light-blocking film 65 is provided on the substrate 21. The light-blocking film 65 is provided between the semiconductor layer 61 and the substrate 21. The light-blocking film 65 can restrain light from entering a channel area of the semiconductor layer 61 from the substrate 21 side.

An undercoat film 91 is provided on the substrate 21 so as to cover the light-blocking film 65. The undercoat film 91 is formed of, for example, an inorganic insulating film such as a silicon nitride film or a silicon oxide film. The undercoat film 91 is not limited to being configured as a single-layer film and may be configured as a multilayered film of a plurality of stacked inorganic insulating films. An undercoat film may also be provided between the substrate 21 and the light-blocking film 65.

The first switching elements Tr (transistors) are provided above the substrate 21. The semiconductor layer 61 is provided on the undercoat film 91. For example, polysilicon is used as the semiconductor layer 61. The semiconductor layer 61 is, however, not limited thereto and may be formed of, for example, a microcrystalline oxide semiconductor, an amorphous oxide semiconductor, or low-temperature polysilicon. Although only an n-type TFT is illustrated as the first switching element Tr, a p-type TFT may be formed together with the n-type TFT.

A gate insulating film 92 is provided on the undercoat film 91 so as to cover the semiconductor layer 61. The gate insulating film 92 is, for example, an inorganic insulating film such as a silicon oxide film. The gate electrode 64 is provided on the gate insulating film 92. In the example illustrated in FIG. 6, the first switching element Tr has a top-gate structure. However, the first switching element Tr is not limited thereto and may have a bottom-gate structure, or a dual-gate structure in which the gate electrodes 64 are provided on both the upper side and lower side of the semiconductor layer 61.

An interlayer insulating film 93 is provided on the gate insulating film 92 so as to cover the gate electrode 64. The interlayer insulating film 93 has, for example, a multilayered structure of a silicon nitride film and a silicon oxide film. The source electrode 62 and the drain electrode 63 are provided on the interlayer insulating film 93. The source electrode 62 is coupled to a source area of the semiconductor layer 61 through the second contact hole CH2 provided in the gate insulating film 92 and the interlayer insulating film 93. The drain electrode 63 is coupled to a drain area of the semiconductor layer 61 through the third contact hole CH3 provided in the gate insulating film 92 and the interlayer insulating film 93.

The first organic insulating film 94 is provided on the interlayer insulating film 93 so as to cover the source electrode 62 and the drain electrode 63 of the first switching element Tr. The first organic insulating film 94 is an organic planarizing film and has a better coverage property for wiring steps and provides better surface flatness than inorganic insulating materials formed by, for example, chemical vapor deposition (CVD).

The photodiodes PD are provided above the first organic insulating film 94. The first electrodes 23 and the insulating film 95 are provided between both the substrate 21 and the first organic insulating film 94 and the photodiodes PD in the direction orthogonal to the surface of the substrate 21.

In more detail, each of the first electrodes 23 is provided on the first organic insulating film 94 and is provided so as to cover the bottom surface and the inner side surface of the first contact hole CH1 formed in the first organic insulating film 94. The first electrode 23 is coupled, at the bottom surface of the first contact hole CH1, to the source electrode 62 of the first switching element Tr. The first electrode 23 is a cathode electrode of the photodiode PD and is formed of a light-transmitting conductive material such as indium tin oxide (ITO) or indium zinc oxide (IZO). The first electrodes 23 are arranged so as to be separated from one another for each of the detection elements PAA (photodiodes PD). The photodiode PD has a larger area than that of the first electrode 23 in the plan view and covers the upper surface and an outer edge 23e of the first electrode 23.

The insulating film 95 is provided between the adjacent first electrodes 23 and is provided so as to cover the outer edges 23e of the first electrodes 23. In the present embodiment, the insulating film 95 is an inorganic insulating film and is made using a material such as a silicon nitride film or an aluminum oxide film. The insulating film 95 has at least one or more of the openings OP (refer to FIG. 5) in an area overlapping the upper surface of the first electrode 23. The photodiode PD is electrically coupled to the first electrode 23 through the opening OP.

The insulating film 95 is provided between the first organic insulating film 94 and the photodiode PD in an area between the adjacent first electrodes 23. The insulating film 95 thereby insulates the adjacent first electrodes 23 from each other. In other words, the insulating film 95 can reduce leakage currents between the adjacent photodiode PDs. The insulating film 95 also serves as a barrier film that restrains water from entering the photodiode PD from the first organic insulating film 94 in the area between the adjacent first electrodes 23.

The second organic insulating film 96 is provided so as to cover the inside of the first contact hole CH1. The first electrode 23 and the second organic insulating film 96 are stacked on the inner side surface and the bottom surface of the first contact hole CH1. The first organic insulating film 94, the first electrode 23, and the second organic insulating film 96 are stacked in this order on the inner side surface of the first contact hole CH1. The first electrode 23 and the second organic insulating film 96 are stacked on the source electrode 62 in this order at the bottom surface of the first contact hole CH1. The second organic insulating film 96 is provided so as to cover a corner 23t of the first electrode 23 in a position overlapping the open end of the first contact hole CH1.

The photodiodes PD are provided so as to cover the first electrodes 23, the insulating film 95, and the second organic insulating film 96. In more detail, each of the photodiodes PD includes an active layer 31, the electron transport layer 32 (first carrier transport layer), and a hole transport layer 33 (second carrier transport layer). The electron transport layer 32 (first carrier transport layer) is provided between the active layer 31 and the first electrode 23. The hole transport layer 33 (second carrier transport layer) is provided between the active layer 31 and the second electrode 24.

The electron transport layer 32 is formed by coating using a material such as zinc acetate, ethoxylated polyethylenimine (PEIE), or polyethylenimine (PEI). The electron transport layer 32 is a single layer and has a thickness of, for example, approximately 30 nm or less.

A mixture of a p-type organic semiconductor and an n-type organic semiconductor is used as the active layer 31. PMDPP3T(poly((2,5-bis(2-hexyldecyl)-2,3,5,6-tetrahydro-3,6-dioxopyrrolo(3,4-c)pyrrole-1,4-diyl)-alt-(3',3''-dimethyl-2,2':5',2''-terthiophene)-5,5''-diyl)) is an example of the p-type organic semiconductor. PC61BM([6,6]-phenyl C61-butyric acid methyl ester) is an example of the n-type organic semiconductor. The thickness of the active layer 31 is, for example, approximately from 100 nm to 500 nm, and preferably approximately 350 nm.

The hole transport layer 33 is, for example, a metal oxide layer of, for example, tungsten oxide ($WO_3$) or a molybdenum oxide (MoOx). The hole transport layer 33 is formed of a vapor-deposited film or a sputtered film and has a thickness of, for example, approximately 30 nm or less.

The electron transport layer 32, the active layer 31, and the hole transport layer 33 forming the photodiodes PD are provided so as to cover the first electrodes 23, the insulating film 95, and the second organic insulating film 96. The electron transport layer 32 is coupled to the first electrodes 23 in areas overlapping the openings OP of the insulating film 95. The electron transport layer 32 includes an overlapping portion 32s provided on the insulating film 95 and an overlapping portion 32t provided on the second organic insulating film 96 in an area overlapping the first contact hole CH1.

In the detection device 1, the first organic insulating film 94, the first electrode 23, the electron transport layer 32, the active layer 31, the hole transport layer 33, and the second electrode 24 are stacked in this order in the direction orthogonal to the substrate 21 in an area overlapping the first electrode 23. In the area overlapping the first contact hole CH1, the first electrode 23, the second organic insulating film 96, the electron transport layer 32 (overlapping portion 32t), the active layer 31, the hole transport layer 33, and the second electrode 24 are stacked in this order. In the area between the adjacent first electrodes 23, the first organic insulating film 94, the insulating film 95, the electron transport layer 32 (overlapping portion 32s), the active layer 31, the hole transport layer 33, and the second electrode 24 are stacked in this order.

As described above, the insulating film 95 is provided between the adjacent first electrodes 23 and covers the outer edges 23e of the first electrodes 23. With this configuration, the insulating film 95 can reduce the occurrence of the short circuit between the active layer 31 and the first electrode 23, even if the electron transport layer 32 is formed thinner in a position overlapping the outer edge 23e of the first electrode 23 and step disconnection occurs between the overlapping portion 32s and the electron transport layer 32 on the first electrode 23. For ease of understanding, FIG. 7 illustrates a case where the overlapping portion 32s and the electron transport layer 32 on the first electrode 23 are separately formed from each other. However, the overlapping portion 32s and the electron transport layer 32 on the first electrode 23 may be continuously formed in one piece.

Furthermore, the second organic insulating film 96 is provided so as to cover the inside of the first contact hole CH1 and covers the corner 23t of the first electrode 23 formed at the open end of the first contact hole CH1. This configuration planarizes the area overlapping the first contact hole CH1 and forms the overlapping portion 32t of the electron transport layer 32 continuously with the electron transport layer 32 on the first electrode 23. The second organic insulating film 96 covers most of the area of the first electrode 23 inside the first contact hole CH1. With this configuration, the second organic insulating film 96 can reduce the occurrence of the short circuit between the active layer 31 and the first electrode 23, even if the electron transport layer 32 is partially formed thinner or has a step disconnection in the area overlapping the first contact hole CH1.

Since the second organic insulating film 96 planarizes the area overlapping the first contact hole CH1, variations in thicknesses of the active layer 31, the electron transport layer 32, and the hole transport layer 33 that form the photodiode PD are reduced over the area overlapping the first contact hole CH1 and areas not overlapping the first contact hole CH1. That is, as compared with a configuration in which the second organic insulating film 96 is not provided, the thinning and the step disconnection of the active layer 31, the electron transport layer 32, and the hole transport layer 33 are reduced in the area overlapping the first contact hole CH1. As a result, the detection device 1 can reduce a leakage current between the anode and cathode of the photodiode PD.

The second electrode 24 is provided on the photodiodes PD. More specifically, the second electrode 24 is provided on the hole transport layer 33 of the photodiode PD. The second electrode 24 is an anode electrode of the photodiode PD and is continuously formed over more than one of the detection elements PAA (photodiodes PD). The second electrode 24 is made using a metal material such as silver (Ag) and serves as a reflective electrode. The second electrode 24 is not limited to this material and may be formed of a light-transmitting conductive material in the same manner as the first electrode 23.

The sealing films 97a, 97b, and 97c are provided on the second electrode 24. An inorganic film such as a silicon nitride film or an aluminum oxide film is used as each of the sealing films 97a and 97c. A resin film of, for example, an acrylic material is used as the sealing film 97b. The sealing films 97a, 97b, and 97c are not limited to the layered films in which the inorganic and organic insulating films are stacked, and may be a single-layered film. The resin mask 98 is further provided so as to cover the sealing film 97c. The sealing films 97a, 97b, and 97c and the resin mask 98 well seal the photodiodes PD and thus can restrain water from entering the photodiodes PD from the upper surface side thereof.

The thickness of the first electrode 23 is approximately 50 nm, for example. The thickness of the second electrode 24 is approximately 100 nm or smaller, for example. That is, the thickness of each of the electron transport layer 32 and the hole transport layer 33 is less than that of the active layer 31 and less than that of each of the first and the second electrodes 23 and 24. In other words, the thickness of each of the first and the second electrodes 23 and 24 is less than that of the active layer 31 and greater than that of each of the electron transport layer 32 and the hole transport layer 33.

The materials and the manufacturing methods of the electron transport layer 32, the active layer 31, and the hole transport layer 33 are merely exemplary, and other materials and manufacturing methods may be used. For example, the electron transport layer 32 may be a vapor-deposited film or a sputtered film using a material such as zinc oxide (ZnO) or a titanium oxide ($TiO_2$). The hole transport layer 33 may be a vapor-deposited film or a sputtered film using a material such as nickel oxide (NiO), or the hole transport layer 33 may be formed by coating using nanoparticle ink of, for example, a vanadium oxide ($V_2O_5$) or tungsten oxide ($WO_3$), or using a material such as PEDOT:PSS.

The planar and sectional shapes of the insulating film 95 and the second organic insulating film 96 illustrated in FIGS. 5 and 7 are merely schematically illustrated and can be changed as appropriate. For example, the upper surface of the second organic insulating film 96 is not limited to a configuration having a curved surface and may be partially formed flat. The planar shape of the second organic insulating film 96 is not limited to a quadrilateral shape and may be another shape such as a circular shape or a polygonal shape depending on the planar shape of the first contact hole CH1. The shape of the opening OP formed in the insulating film 95 is not limited to a quadrilateral shape and can be changed as appropriate depending on the shape of the first electrode 23.

As described above, the detection device 1 of the present embodiment includes the photodiodes PD provided on the substrate 21, the transistors (such as the first switching element Tr) provided corresponding to the photodiodes PD, the first organic insulating film 94 that covers the transistors, the first electrodes 23 that are provided between the first organic insulating film 94 and the photodiodes PD in the direction orthogonal to the substrate 21 and are provided corresponding to the photodiodes PD, the second electrode 24 provided so as to extend across the photodiodes PD, the insulating film 95 provided between the adjacent first electrodes 23, and the second organic insulating film 96 that covers the inside of the first contact hole CH1 provided in the first organic insulating film 94. The photodiodes PD include the first carrier transport layer (electron transport layer 32), the active layer 31, and the second carrier transport layer (hole transport layer 33) that are stacked on the substrate 21. The first carrier transport layer (electron transport layer 32), the active layer 31, and the second carrier transport layer (hole transport layer 33) are provided so as to cover the first electrodes 23, the insulating film 95, and the second organic insulating film 96.

According to this configuration of the detection device 1, using the insulating film 95 and the second organic insulating film 96 can reduce the occurrence of the short circuit between the active layer 31 and the first electrodes 23, even if the electron transport layer 32 is formed thinner in the position overlapping the outer edge 23e of the first electrode 23, or in the position overlapping the first contact hole CH1, and thus, the step disconnection occurs.

Second Embodiment

FIG. 8 is a sectional view illustrating a section of a detection device according to a second embodiment. In the following description, the same components as those described in the embodiment above are denoted by the same reference numerals, and the description thereof will not be repeated.

As illustrated in FIG. 8, in a detection device 1A according to the second embodiment, an insulating film 95A formed between the adjacent first electrodes 23 is an organic insulating film having a different thickness from that of the second organic insulating film 96. The insulating film 95A is thicker than the insulating film 95 (see FIG. 7), which is formed with an inorganic insulating film. More specifically, a thickness T1 of the second organic insulating film 96 is greater than a thickness T2 of the insulating film 95A. The thickness T1 of the second organic insulating film 96 is a distance from the upper surface of the first electrode 23 located at the bottom of the first contact hole CH1 to the upper surface of the second organic insulating film 96 in the direction orthogonal to the substrate 21. The thickness T2 of the insulating film 95A is a distance from the upper surface of the first organic insulating film 94 to the upper surface of the insulating film 95A in the direction orthogonal to the substrate 21.

The insulating film 95A can be formed in the same process using the same organic insulating material as the second organic insulating film 96. For example, when the organic insulating material is applied to be formed, then normal exposure is performed on areas where the openings OP are formed, and what is called half exposure is performed on areas where the insulating film 95A is formed between the first electrodes 23, the insulating film 95A can be made to have the thickness T2 different from that of the second organic insulating film 96.

The insulating film 95A is provided so as to cover the outer edges 23e of the first electrodes 23 in the same manner as in the first embodiment. The electron transport layer 32 is provided so as to cover the first electrodes 23, the insulating film 95A, and the second organic insulating film 96. The overlapping portion 32s provided on the insulating film 95A is formed continuously with the electron transport layer 32 on the first electrode 23. However, also in the detection device 1A of the present embodiment, since the insulating film 95A covers the outer edge 23e of the first electrode 23, the occurrence of the short circuit between the active layer 31 and the first electrode 23 can be reduced even if the step disconnection occurs between the overlapping portion 32s and the electron transport layer 32 on the first electrode 23.

The sectional shape and the thickness T2 of the insulating film 95A illustrated in FIG. 8 are merely schematically illustrated, and can be changed as appropriate. For example, the upper surface of the insulating film 95A is not limited to a configuration having a curved surface and may be partially formed flat. The method of manufacturing the insulating film 95A is merely exemplary. The insulating film 95A may be formed in any way.

In the first and the second embodiments described above, the photodiode PD is formed having the configuration in which the electron transport layer 32, the active layer 31, and the hole transport layer 33 are stacked in this order from the substrate 21 side in the direction orthogonal to the substrate 21. However, in the detection devices 1 and 1A, the stacking order in the photodiode PD is not limited to this order and may be reversed. That is, the photodiode PD may have a configuration in which the hole transport layer 33 (first carrier transport layer), the active layer 31, and the electron transport layer 32 (second carrier transport layer) are stacked in this order in the direction orthogonal to the substrate 21. In this case, the first electrode 23 serves as the anode electrode of the photodiode PD, and the second electrode 24 serves as the cathode electrode of the photodiode PD.

While the preferred embodiments of the present invention have been described above, the present invention is not limited to the embodiments described above. The content disclosed in the embodiments is merely an example, and can be variously modified within the scope not departing from the gist of the present invention. Any modifications appropriately made within the scope not departing from the gist of the present invention also naturally belong to the technical scope of the present invention. At least one of various omissions, substitutions, and changes of the components can be made without departing from the gist of the embodiments described above and modifications thereof.

What is claimed is:

1. A detection device comprising:
    a plurality of photodiodes provided on a substrate;
    a plurality of transistors provided corresponding to the photodiodes;
    a first organic insulating film that covers the transistors;
    a plurality of first electrodes that are provided between the first organic insulating film and the photodiodes in a direction orthogonal to the substrate and are provided corresponding to the photodiodes;
    a second electrode provided so as to extend across the photodiodes;
    an inorganic insulating film provided between adjacent first electrodes of the first electrodes so as to cover outer edges of the first electrodes, and
    a second organic insulating film that covers an inside of a contact hole provided in the first organic insulating film, wherein
    in the photodiodes comprising a first carrier transport layer, an active layer, and a second carrier transport layer that are stacked on the substrate, the first carrier transport layer is disposed being in contact with each of the first electrodes, the inorganic insulating film, and the second organic insulating film,
    the first carrier transport layer includes a first electrode overlapping portion disposed on the first electrode and an insulating film overlapping portion disposed on the inorganic insulating film,
    the first electrode overlapping portion is separated from the insulating film overlapping portion, and
    the inorganic insulating film is disposed between the first electrode overlapping portion and the insulating film overlapping portion that are separated from each other.

2. The detection device according to claim 1, wherein each of the first electrodes is provided so as to cover an upper side of the first organic insulating film and an inner side surface of the contact hole and is electrically coupled, at a bottom surface of the contact hole, to a corresponding transistor of the transistors, and
    the first electrode, the second organic insulating film, the first carrier transport layer, the active layer, the second carrier transport layer, and the second electrode are stacked in the order as listed, in an area overlapping the contact hole.

3. The detection device according to claim 1, wherein each first electrode, the second electrode, or both are made of a light-transmitting conductive material.

4. The detection device according to claim 1, wherein either each first electrode or the second electrode is a cathode electrode, and
    another of the first electrode and the second electrode is an anode electrode.

5. The detection device according to claim 1, wherein one of the first carrier transport layer and the second carrier transport layer is a hole transport layer, and
    another of the first carrier transport layer and the second carrier transport layer is an electron transport layer.

6. The detection device according to claim 1, wherein the first electrodes are partitioned by the inorganic insulating film.

* * * * *